United States Patent [19]

Ohno

[11] Patent Number: 4,831,422

[45] Date of Patent: May 16, 1989

[54] FIELD EFFECT TRANSISTOR

[75] Inventor: Yasuo Ohno, Tokyo, Japan

[73] Assignee: NEC Corporation, Tokyo, Japan

[21] Appl. No.: 829,038

[22] Filed: Feb. 13, 1986

[30] Foreign Application Priority Data

Feb. 13, 1985 [JP] Japan .................................. 60-25476

[51] Int. Cl.[4] ............................................ H01L 29/78
[52] U.S. Cl. .................................. 357/233; 357/23.8; 357/28
[58] Field of Search ........................ 357/23.3, 28, 23.1, 357/23.3, 23.4, 23.8, 23.12, 23.13, 28

[56] References Cited

U.S. PATENT DOCUMENTS

| | | | |
|---|---|---|---|
| 3,660,697 | 5/1972 | Berglund et al. | 357/24 X |
| 3,735,156 | 5/1973 | Krambeck et al. | 357/24 X |
| 4,622,569 | 11/1986 | Lade et al. | 357/23.4 |
| 4,644,386 | 2/1987 | Nishizawa et al. | 357/23.12 X |

OTHER PUBLICATIONS

Fichtner, W. et al., "Experimental Results on Sub-Micron-Size P Channel MOSFETs", IEEE Electron Device Letters, vol. EDL-3, Feb. 1982, pp. 34–36.

Primary Examiner—Andrew J. James
Assistant Examiner—Sara W. Crane
Attorney, Agent, or Firm—Sughrue, Mion, Zinn, Macpeak & Seas

[57] ABSTRACT

A field effect transistor having a short channel length of 1 μm or less is disclosed. The transistor includes a plurality of impurity regions provided in the channel region between the source and drain regions. The impurity region has the same conductivity type as the channel produced between the impurity regions and a higher impurity density than the carrier density of the channel so that the heat in the carriers is transferred laterally to the impurity regions.

10 Claims, 5 Drawing Sheets

FIELD EFFECT TRANSISTOR

BACKGROUND OF THE INVENTION

The present invention relates to a field effect transistor, and more particularly to an insulated gate type field effect transistor having a short channel length.

Recently, the channel length between the source and drain regions of the insulated gate type field effect transistor has become short, as short as 1 μm or less, for realizing high speed operation by reducing the capacity between the gate electrode and the channel region. However, such a short channel transistor inevitably has applied therein a high electric field along the channel direction, and therefore, a carrier temperature, that is, an electron temperature in an N-channel type transistor in the channel region rises to an unexpectedly high level. In this case, the carrier speed becomes saturated because of a reduction of carrier mobility by the high temperature condition mentioned above. Then, the desired amount of drain current which would be expected from the mobility of the carrier at a low electric field intensity cannot be obtained. Therefore, in the prior art, the effect of speeding up of the short channel transistor is due to the reduction of the gate capacity alone, and any increase in the drain current does not contribute. Further, the carrier of the high temperature under the high electric field intensity is injected into the gate insulating film, and causes the deterioration of the device.

SUMMARY OF THE INVENTION

Accordingly, an object of the present invention is to provide an effective field effect transistor in which the carrier in the channel region hardly attains a high temperature even in a condition of a short channel and a high electric field intensity, and therefore, the drain current can be increased so as to speed up the circuit operation, and the deterioration of the device by injecting the hot carriers into the gate insulating film can be prevented.

According to one feature of the present invention, there is provided a field effect transistor comprising a semiconductor substrate having a major surface of one conductivity type, source and drain regions of the opposite conductivity type formed in the major surface of the substrate, a channel region in the substrate between the source and drain regions, a gate electrode formed on the channel region, and a plurality of impurity regions of the opposite conductivity type formed in the channel region under the gate electrode. The impurity regions are separated from each other and from the source and drain regions, and any electrode or wiring layer is not connected thereto. The interval L between one impurity region and an adjacent impurity region and that between source and drain regions and adjacent impurity regions preferably are 0.2 μm or less. To reduce effectively the temperature of carrier in the intervals, that is, channels in the operation state, the impurity region preferably has a depth of 200 Å to 500 Å, and an impurity density of $10^{13}$ atoms/cm$^2$ or more such that the impurity density attains a higher level than a carrier density in a channel produced in portions of the channel region under an operation condition, that is, an ON state of the transistor. Portions of the channel region are free from the impurity regions. The source and drain regions have the same impurity density as the impurity region preferably is favorably 0.02 μm or more in view of the effective reduction of the carrier temperature, and in view of the gate capacity between the gate electrode and the total channel region. The length l preferably is 0.2 μm to 0.02 μm.

DETAILED DESCRIPTION OF THE CONSTRUCTION

Generally, a current which flows through a semiconductor conduction layer, that is, the channel region generates heat in accordance with Joule's Law. It is carriers, that is, electrons or holes that are heated, and the temperature of the carriers does not seriously rise if the current (drain current) is small and the electric field along the channel region is also small. However, when the semiconductor device is microminiaturized and the internal electric field is increased as well as the current thereof, the Joule's heat becomes large so that the carrier temperature seriously rises. As the carrier mobility is lowered in inverse proportion to the rise of carrier temperature, the speed of carrier does not heighten in proportion to the electric field, and it becomes saturated. That is what is called "speed saturation". A transistor having a channel length of 1 μm or less only permits a current at a value which is several times smaller than the value which may be estimated by assuming that there is no speed saturation phenomenon. Thus, there is a barrier to the designing of a high speed device.

As these phenomena are due to inadequate transference of the Joule's heat from the carrier to the crystal, this problem can be solved by efficient heat transference. The present invention provides a means to such end.

Let the carrier density in the channel surface of a field effect transistor be "N", the electric field in the current direction be "E", the carrier mobility be "μ", the carrier temperature be "Tc", the crystal temperature by "Tx", electric charge of the unit carrier be "q", and the time constant for heat transference of the heat of carrier being transferred to the crystal be "τ", $$\text{Current } I = Nq\mu E. \tag{1}$$

$$\text{Heat generation } Q_I = IE = I^2/Nq\mu. \tag{2}$$

Heat transference from the carrier to the $$\text{crystal } Qx = N(Tc - Tx)/\tau. \tag{3}$$

In the stationary state, $Q_I = Qx$, when a constant current I flows, $$Tc = Tx + \tau I^2/N^2 q\mu. \tag{4}$$

This indicates that the larger the value of N (carrier density), the smaller the rise in temperature. It is to be noted that carrier density corresponds to impurity density.

If a region of smaller N (carrier density or impurity density) is abutted against a region of larger N, the heat of carriers in the region of smaller N flows to the region of larger N by heat conduction, the carrier temperature thereby being reduced. Assuming that a first region of smaller N having a length L is abutted against second region of larger N at the opposite sides, and that, in the first region, the degree of heat transference from carrier to the crystal of the first region is negligibly small in comparison with the transference to the second regions.

The heat transmitting in the first region is represented by, instead of the formula (3), the formula of heat condition:

$$Q_y = K \frac{d^2 Tc}{dX^2} \quad (5)$$

In the formula (5), "K" indicates the carrier thermal conductivity, and "X" indicates the distance along the first region, that is, the channel region.

In accordance with the formulas (2) and (5), the maximum temperature Tmax at the region having low carrier density is, $$T\max = Tx + \frac{1}{8}\left(\frac{Nq\mu}{K}\right) E^2 L^2. \quad (6)$$

$K/Nq\mu T = 2.445 \times 10^{-8}$ $W \cdot \Omega/\deg^2$ from the law of Wiedeman-Franz.

Generally, in the field effect transistor, the reduction of the carrier mobility must be limited to at least ½ of the carrier mobility at room temperature (300° K.). Therefore, Tmax. must be 600° K., which is selected to be twice as high as room temperature. Then, $$L < 0.133/E. \quad (7)$$

This formula is independent of the kind of carrier such as electron and positive hole and of the kind of material forming the crystal such as silicon and GaAs. In this state, the concrete value of L with respect to silicon is shown as follows. Considering that the speed saturation phenomena in silicon occurs when the electric charge intensity becomes about $Ec = 7 \times 10^3$ V/cm, let this formula be substituted E in the formula (7). $L < 0.2$ μm is then obtained. In short, the cooling of carrier is effective on condition that the electric charge intensity E, which occurs in the channel region and has a lateral direction between source and drain region, is not less than Ec and $L < 0.2$ μm is satisfied. For the purpose of cooling carrier in an electric field of higher intensity, the region which is interposed between regions of high carrier density is required to be reduced with respect to the length L in the formula (7).

DETAILED DESCRIPTION OF THE PREFERRED EMBODIMENT

Figure 1:
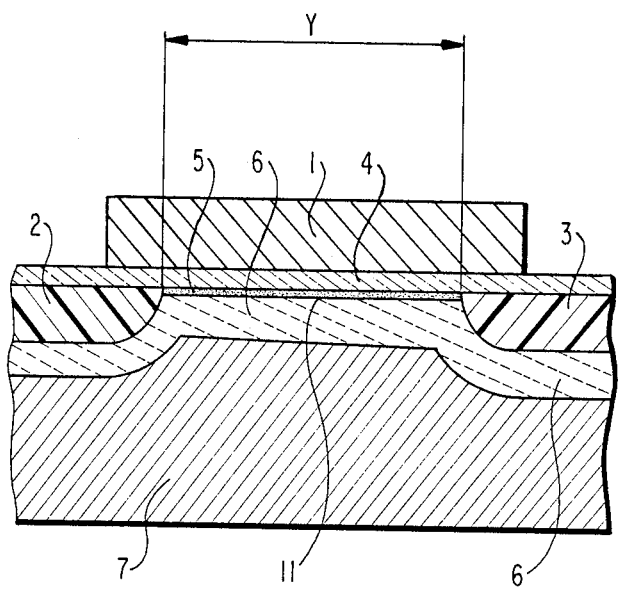
FIG. 1 is a cross-sectional view of a conventional insulated gate type field effect transistor.

Referring to FIG. 1, and N-channel type insulated gate field effect transistor in the prior art is disclosed. In the P-type silicon substrate 7, the N-type source region 2 and the N-type drain region 3 are formed, and the gate electrode 1 is provided on the channel region 11 between the source and drain regions via the gate insulating film 4. In the operation state, the substrate 7 and the source region 2 maintain ground potential, and the drain region 3 and the gate electrode 1 are connected to positive voltage sources, respectively. Then, the N-type inversion layer 5, that is, the channel is produced at the surface of the channel region 11, and also the depletion layer 6 is produced. Electrons as carriers flow from the source region to the drain region in the channel. When the transistor is of a short channel type such as one in which the channel length Y is about 0.5 μm, a strong electric field such as $7 \times 10^3$ V/cm is produced in the channel. Therefore, the temperature of the electrons becomes a high, and the electron mobility is reduced by the high temperature condition. Then, the drain current is decreased and an expected high speed operation cannot be expected.

Figure 2A:
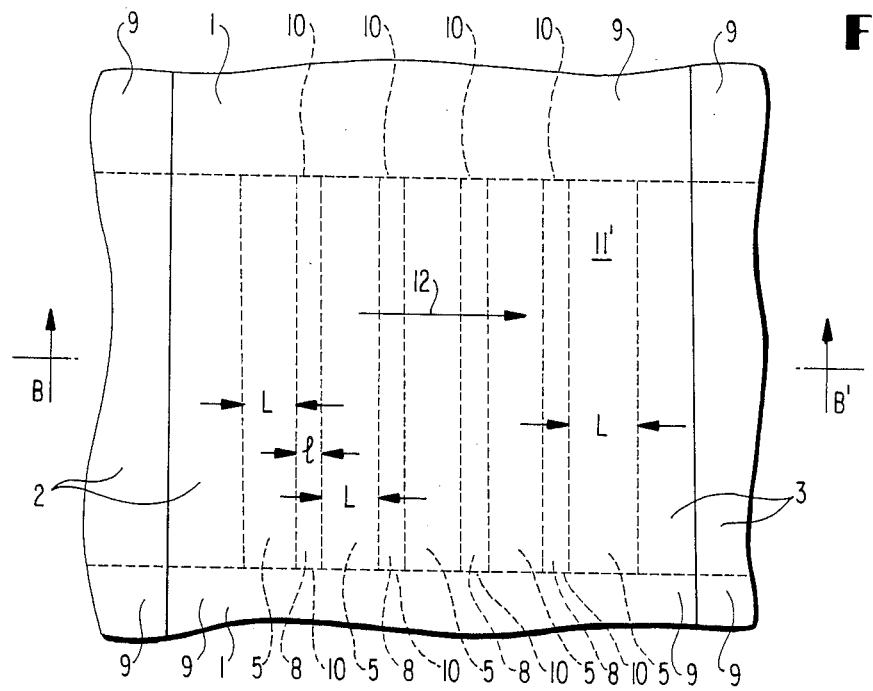
FIG. 2A is a plan view of an embodiment of the present invention.
Figure 2B:
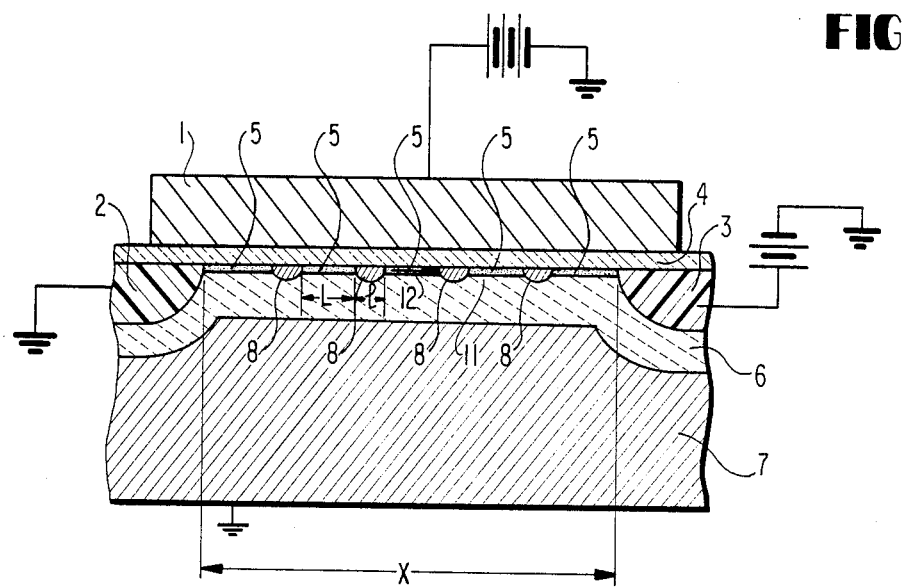
FIG. 2B is a cross-sectional view taken along line B—B′ in FIG. 2A as viewed in the direction of arrows.

Referring to FIGS. 2A and 2B of an embodiment of the present invention, in which elements like those FIG. 1 have been identified with like numerals, a plurality of strip type N-type impurity regions 8 having a high impurity density are provided in the channel region 11′ by ion injection of arsenic. The photo resist patterning may conducted by means of electron beam exposure, or by a converging ion beam method without using any masks.

More particularly, in the P-type silicon substrate 7 of $1 \times 10^{16}/cm^3$ impurity concentration, N-type source and drain regions 2, 3 of high impurity density and of 0.3 μm depth are formed from the major surface of the substrate. The gate electrode 1 of for example, polycrystalline silicon is provided on the channel region 11′ via the gate insulating film 4 made of silicon oxide and having a thickness of 400 Å. Each of the N-type impurity regions 8 has a high impurity density of $10^{13}$ $cm^{-2}$ or more, depth of 200 Å to 500 Å and a length l of 200 Å to 2000 Å, and maintains an interval L of not more than 2000 Å (0.2 μm) from each other and from the source and drain regions. The intervals act as the actual channel region which decides the characteristics such as the threshold voltage (Vth) etc. of the transistor. Each impurity region 8 is abutted against the thick field insulating layer 9 (FIG. 2A) at both ends 10 and maintains a floating state such that any electrode or wiring is not connected thereto. In the intervals, the effective channels, that is, N-type inversion layers 5 having a carrier density of about $10^{12}$ $cm^{-2}$ are produced when the substrate 7 and the source region 2 are connected to a ground terminal, and the drain region 3 and the gate electrode 1 are connected to the positive voltage terminals, respectively. In this operation state, electrons as carriers flow from the source region to the drain region under the strong electric field 12 such as $7 \times 10^3$ V/cm produced in the channel. According to the present invention, the carrier temperature in the regions 5 can be maintained at 600° K. or less, and therefore the large drain current can be obtained in comparison with the prior art transistor of FIG. 1.

Figure 3:
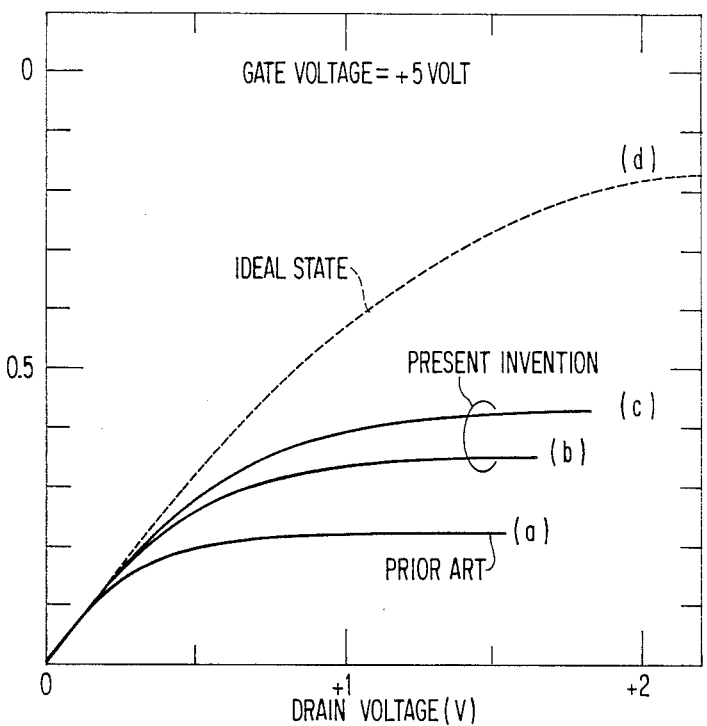
FIG. 3 is a diagram showing a comparison between current and voltage characteristics provided by the present invention and the conventional structure, in which a line (a) represents the conventional method, (b) and (c) represent the present invention, and (d) represents the assumptive case in which the electric charge temperature does not rise.

The effect of a device provided by the present invention is compared with a transistor formed with the conventional structure, and the results are shown in FIG. 3. The oxide film thickness of 400 Å, the depletion layer depth of 400 Å and the source and drain region having a high impurity density are assumed as common factors. A line (a) represents the conventional structure shown in FIG. 1 in which the channel length Y is 0.48 μm. A line (b) represents the structure according to the present invention shown in FIG. 2 in which, in a channel region 11' having the length X of 0.74 μm, are provided four stripes of regions 8 having an impurity density of $10^{13}/cm^2$ and a length l of 0.05 μm and disposed at intervals of about L=0.11 μm in parallel relationship with the source and the drain. A line (c) represents the structure which is so designed as to allow a substantially equal drain current to flow when the drain voltage is low and the electron (carrier) temperature does not rise and in which, in a channel region having a length of 0.85 μm, there are provided six strips of impurity regions similar to those described above which are spaced apart at intervals of about L=0.075 μm in parallel relationship with the source and the drain. It will be understood from FIG. 3 that, according to the present invention, the drain current can flow at a rate almost twice as can high as a device in the conventional structure. A curve (d) in FIG. 3 indicates the value estimated by assuming that the carrier temperature does not rise at all. The same +5 volt gate voltage is applied to the gate electrode in each curve (a) to (d).

Figure 4:
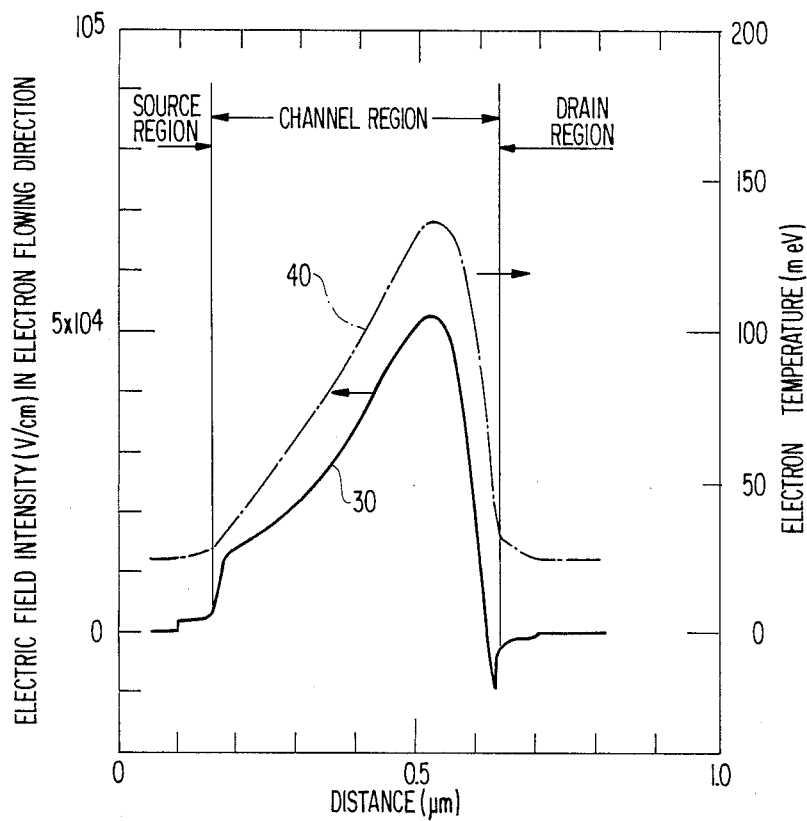
FIGS. 4 and 5 are diagrams respectively showing the electric field intensity and the electron (carrier) temperature with respect to the transistors shown in at (a) and (c) in FIG. 3 at the drain voltage of 1.4 V.
Figure 5:
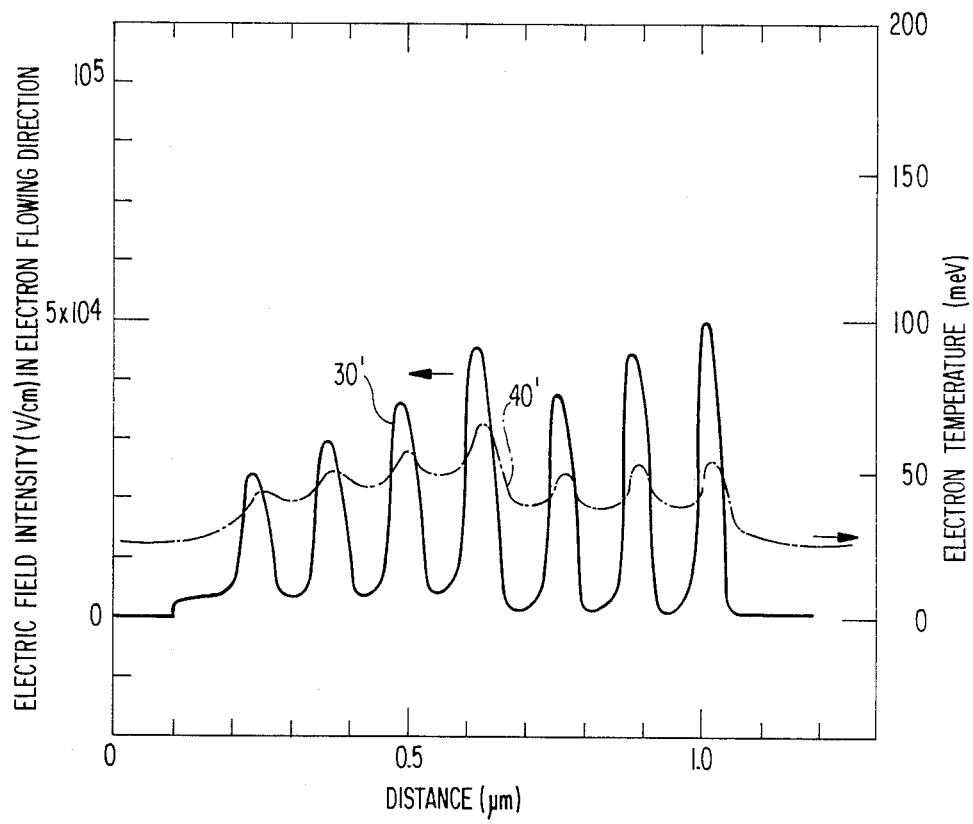
Figure 6:
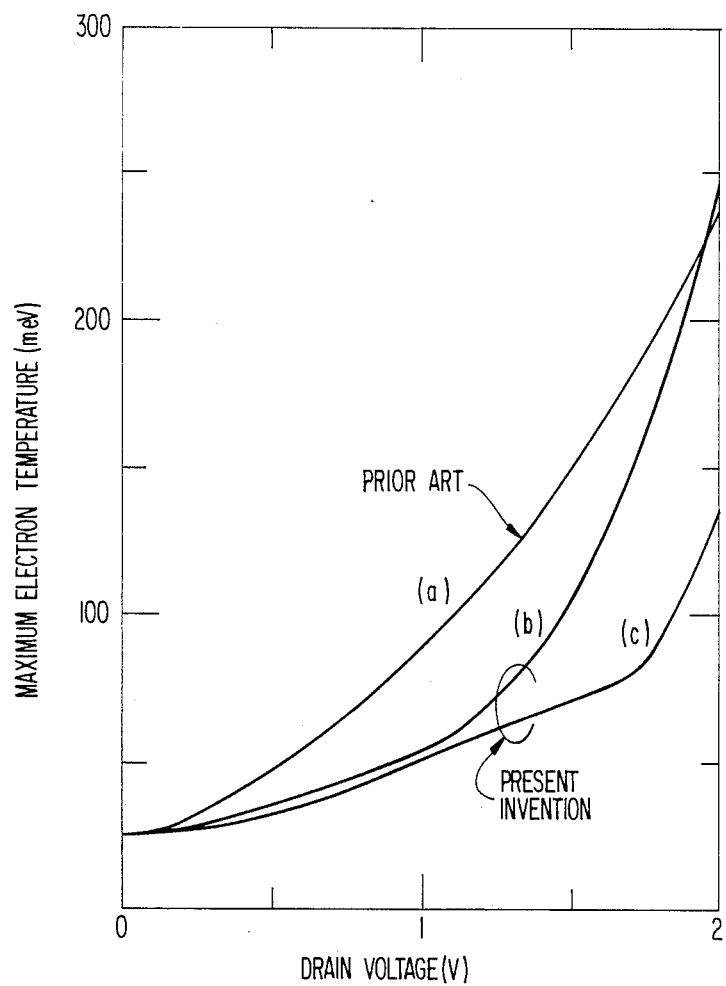
FIG. 6 is a diagram showing a comparison, such as shown in FIG. 3, between the maximum electron temperatures in channels of the transistors of the present invention and the conventional type.

FIG. 4 shows the distributions of electric fields (curve 30) and electron (carrier) temperature (curve 40) at a drain voltage $V_d=1.4$ V in the transistor of the conventional type (FIG. 1 and curve (a) in FIG. 3). On the other hand, FIG. 5 shows the distributions of electric fields (curve 30') and electron (carrier) temperature (curve 40') at a drain voltage $V_d=1.4$ V in the transistor according to the present invention (curve (c) in FIG. 3). As seen in the figures, the carrier temperature is considerably low in the transistor of the present invention compared with the conventional type, while both transistors have substantially the same maximum electric field intensity. FIG. 6 shows a comparison between the relevant maximum carrier temperature of the transistors whose currents are shown in FIG. 3. It will be understood that, in the transistor according to the present invention, the rise of carrier temperature caused by the drain voltage is retarded and the pinch off voltage is heightened, the saturation current of the transistor thus being increased. The above comparisons are made by assuming that the drain currents are constant in an electric field of low intensity. In this case, the transistor according to the present invention is given a heat radiating region, that is, impurity region of a reduced thickness so as to prevent a punch-through phenomenon.

The invention has been described with respect to an MOS transistor, but the present invention is applicable to, for example, a HEMT (High Electron Mobility Transistor) having a GaAs layer on which an n-AlGaAs layer is stacked, a heat radiating region which is formed in the manner such as is applied to the MOS transistor in the above embodiment may be disposed at the interface between n-AlGaAs and GaAs. If the device is wholly formed by the MBE (Molecular Beam Epitaxy) method at a temperature of about 600° C., the fine heat radiating region can be preserved through the thermal diffusion process. Similarly, in an n-type GaAs MESFET, an n-type region may be disposed in a channel region. The GaAs epitaxial layer which becomes an operative layer may have a sufficiently small thickness to reduce difficulty in manufacturing.

In the embodiment described above, the heat radiating region, that is, the impurity region of the opposite conductivity type is provided in the form of a stripe pattern parallel with the drain and the source. However, it is not limited to such a stripe form, and it is also effective when formed otherwise with a view to cooling down the carrier temperature. In short, any other from is possible so long as the drain and the source are not directly coupled.

What is claimed is:

1. A field effect transistor comprising a semiconductor substrate having a major surface of one conductivity type, source and drain regions of the opposite conductivity type formed in said major surface of said substrate, a channel region in said substrate between said source and drain regions, a single, continuous gate electrode formed above said channel region so as to cover said channel region completely, and a plurality of impurity regions of said opposite conductivity type formed in said channel region under said single, continuous gate electrode with an interval of 0.2 μm or less in the direction of the channel region, each of said impurity regions being separated from said source and drain regions.

2. A field effect transistor of claim 1, in which said source region, said impurity regions and said drain region are arranged in one direction with each interval of 0.2 μm or less.

3. A field effect transistor of claim 1, in which the depth of said impurity region ranges from 200 Å to 500 Å.

4. A field effect transistor of claim 1, in which the length of said impurity region in the direction of said source region to said drain region ranges from 0.02 μm to 0.2 μm.

5. A field effect transistor of claim 1, in which said impurity region has a impurity density of $10^{13}$ atoms/$cm^2$ or more.

6. A field effect transistor comprising a semiconductor substrate, source and drain regions formed in a major surface of said substrate, a channel region positioned between said source and drain regions, a gate insulator film formed on said channel region, a single, continuous gate electrode formed on said gate insulator film so as to cover said channel region completely between said source and drain regions, and a plurality of impurity regions formed in said channel region with an interval of 0.2 μm or less in the direction of said channel region, each of said impurity regions being separated from said source and drain regions, the conductivity type of said impurity regions being the same as that of a channel produced in the surface of portions of said channel region under the operation state of said transistor, said operations of said channel region being free from said impurity regions, and the impurity density of said impurity regions being higher than the carrier density of said channel under said operation state.

7. A field effect transistor of claim 6, in which said source region, said impurity regions and said drain region are arranged in one direction with each interval of 0.2 μm or less.

8. A field effect transistor of claim 6, in which the depth of said impurity region ranges from 200 Å to 500 Å.

9. A field effect transistor of claim 6, in which the length of said impurity region in the direction of said source region to said drain region ranges from 0.02 μm to 0.2 μm.

10. A field effect transistor of claim 6, in which said impurity density of said impurity region is $10^{13}$ atoms/$cm^2$ or more.

* * * * *